(12) United States Patent
Scholz et al.

(10) Patent No.: US 9,461,121 B2
(45) Date of Patent: Oct. 4, 2016

(54) PROCESS FOR THE MANUFACTURE OF A DOPED III-N BULK CRYSTAL AND A FREE-STANDING III-N SUBSTRATE, AND DOPED III-N BULK CRYSTAL AND FREE-STANDING III-N SUBSTRATE AS SUCH

(71) Applicant: FREIBERGER COMPOUND MATERIALS GmbH, Freiberg (DE)

(72) Inventors: Ferdinand Scholz, Ulm (DE); Peter Brückner, March-Hugstetten (DE); Frank Habel, Freiberg (DE); Gunnar Leibiger, Freiberg (DE)

(73) Assignee: FREIBERGER COMPOUND MATERIALS GMBH, Freiberg (DE)

( * ) Notice: Subject to any disclaimer, the term of this patent is extended or adjusted under 35 U.S.C. 154(b) by 228 days.

(21) Appl. No.: 14/173,336

(22) Filed: Feb. 5, 2014

(65) Prior Publication Data

US 2014/0151716 A1 Jun. 5, 2014

Related U.S. Application Data

(60) Division of application No. 11/835,669, filed on Aug. 8, 2007, now Pat. No. 8,778,078, which is a continuation of application No. PCT/EP2006/007894, filed on Aug. 9, 2006.

(60) Provisional application No. 60/836,370, filed on Aug. 9, 2006.

(51) Int. Cl.
*H01L 29/20* (2006.01)
*H01L 21/02* (2006.01)
(Continued)

(52) U.S. Cl.
CPC ........... *H01L 29/2003* (2013.01); *C30B 25/00* (2013.01); *C30B 25/02* (2013.01); *C30B 25/165* (2013.01); *C30B 29/403* (2013.01); *C30B 29/406* (2013.01); *H01L 21/0254* (2013.01)

(58) Field of Classification Search
CPC ..... C30B 25/02; C30B 29/406; C30B 29/40; H01L 21/0254
USPC .......................... 428/698; 257/103; 117/952
See application file for complete search history.

(56) References Cited

U.S. PATENT DOCUMENTS

| 5,902,393 A | 5/1999 | Nido et al. |
| 6,156,581 A | 12/2000 | Vaudo et al. |

(Continued)

FOREIGN PATENT DOCUMENTS

| EP | 1 184 489 A2 | 3/2002 |
| EP | 1 271 627 A2 | 1/2003 |

(Continued)

OTHER PUBLICATIONS

Chu et al, "Crystal Growth and Characterization of Gallium Nitride", J. Electrochem. Soc., 121, 1974, pp. 159-162.
(Continued)

*Primary Examiner* — Matthew Song
(74) *Attorney, Agent, or Firm* — Foley & Lardner LLP

(57) ABSTRACT

A process for producing a doped III-N bulk crystal, wherein III denotes at least one element of the main group III of the periodic system, selected from Al, Ga and In, wherein the doped crystalline III-N layer or the doped III-N bulk crystal is deposited on a substrate or template in a reactor, and wherein the feeding of at least one dopant into the reactor is carried out in admixture with at least one group III material. In this manner, III-N bulk crystals and III-N single crystal substrates separated therefrom can be obtained with a very homogeneous distribution of dopants in the growth direction as well as in the growth plane perpendicular thereto, a very homogeneous distribution of charge carriers and/or of the specific electric resistivity in the growth direction as well as in the growth plane perpendicular thereto, and a very good crystal quality.

18 Claims, 4 Drawing Sheets

(51) Int. Cl.
  *C30B 29/40* (2006.01)
  *C30B 25/00* (2006.01)
  *C30B 25/02* (2006.01)
  *C30B 25/16* (2006.01)

(56) References Cited

U.S. PATENT DOCUMENTS

| | | | |
|---|---|---|---|
| 6,177,292 | B1 | 1/2001 | Hong et al. |
| 6,218,269 | B1 | 4/2001 | Nikolaev et al. |
| 6,468,347 | B1 | 10/2002 | Motoki et al. |
| 6,472,690 | B1 | 10/2002 | Manabe et al. |
| 6,555,452 | B2 | 4/2003 | Nikolaev et al. |
| 6,596,079 | B1* | 7/2003 | Vaudo ............ C30B 23/00 117/101 |
| 6,616,757 | B1 | 9/2003 | Melnik et al. |
| 6,812,051 | B2 | 11/2004 | Usui et al. |
| 6,936,357 | B2 | 8/2005 | Melnik et al. |
| 7,132,730 | B2 | 11/2006 | Dwilinski et al. |
| 7,196,399 | B2 | 3/2007 | Usui et al. |
| 7,420,261 | B2 | 9/2008 | Dwilinski et al. |
| 7,655,197 | B2 | 2/2010 | Vaudo et al. |
| 7,915,152 | B2 | 3/2011 | Vaudo et al. |
| 8,048,224 | B2 | 11/2011 | Leibiger et al. |
| 8,212,259 | B2 | 7/2012 | Flynn et al. |
| 2002/0026892 | A1 | 3/2002 | Aoyagi et al. |
| 2002/0028565 | A1 | 3/2002 | Nikolaev et al. |
| 2002/0170484 | A1 | 11/2002 | Katamine et al. |
| 2003/0017685 | A1 | 1/2003 | Usui et al. |
| 2003/0157376 | A1* | 8/2003 | Vaudo ............ C30B 23/00 428/698 |
| 2003/0213964 | A1 | 11/2003 | Flynn et al. |
| 2003/0226496 | A1 | 12/2003 | Melnik et al. |
| 2004/0261692 | A1 | 12/2004 | Dwilinski et al. |
| 2005/0009310 | A1 | 1/2005 | Vaudo et al. |
| 2005/0029507 | A1 | 2/2005 | Usui et al. |
| 2005/0048685 | A1 | 3/2005 | Shibata |
| 2005/0142391 | A1* | 6/2005 | Dmitriev ......... C30B 25/00 428/698 |
| 2005/0164044 | A1 | 7/2005 | Melnik et al. |
| 2005/0212001 | A1 | 9/2005 | Melnik et al. |
| 2007/0040240 | A1 | 2/2007 | Dwilinski et al. |
| 2007/0257334 | A1* | 11/2007 | Leibiger ......... C30B 25/00 257/615 |
| 2009/0072239 | A1 | 3/2009 | Oohira et al. |
| 2010/0289122 | A1 | 11/2010 | Vaudo et al. |
| 2012/0021163 | A1* | 1/2012 | Leibiger ......... C30B 25/00 428/78 |

FOREIGN PATENT DOCUMENTS

| | | |
|---|---|---|
| JP | 02-257678 A | 10/1990 |
| JP | 09-199758 A | 7/1997 |
| JP | 11-189498 A | 7/1999 |
| JP | 2000-091234 | 3/2000 |
| JP | 3 279528 B2 | 2/2002 |
| JP | 2002-075879 A | 3/2002 |
| JP | 2005-506271 A | 3/2002 |
| JP | 2002-343728 A | 11/2002 |
| JP | 2003-527296 A | 9/2003 |
| JP | 2004-244307 A | 9/2004 |
| JP | 2005-206424 A | 8/2005 |
| JP | 2005-327851 A | 11/2005 |
| JP | 2007-184379 A | 7/2007 |
| WO | WO 97/31140 | 8/1997 |
| WO | WO 00/68470 A1 | 11/2000 |
| WO | WO 00/70129 | 11/2000 |
| WO | WO 01/68955 A1 | 9/2001 |
| WO | WO 03/035945 A2 | 5/2003 |
| WO | WO 2005/008738 A2 | 1/2005 |
| WO | WO 2005/064661 A1 | 7/2005 |

OTHER PUBLICATIONS

Monemar et al., "Growth of thick GaN layers with hydride vapour phase epitaxy", J. Cryst. Growth, 281, 2005, pp. 17-31.
Romano et al., "Effects of Si doping on strain, cracking and microstructure in GaN thin films grown by metalorganic chemical vapor deposition", J. Appl. Phys., 87(11), 2000, pp. 7745-7752.
Rosa et al., "Adsorption and incorporation of silicon at GaN(0001) surfaces", Appl. Phys. Lett 80(11), 2002, pp. 2008-2010.
Bi Shuhe, "Research Focuses of Several Group III-V Compound Semiconductor Materials", Thermosetting Resin, No. 4 (1999), pp. 114-117.
Freitas, Jaime A., Jr., Optical studies of hulk and homoepitaxial films of III-V nitride semiconductors, Cryst. Growth, 281(1), 2005, pp. 168-182.
Gogova et al., High-Quality 2" Bulk-Like Free-Standing GaN Grown by HydrideVapour Phase Epitaxy on a Si-doped Metal Organic Vapour Phase Epitaxial GaN Template with an Ultra Low Dislocation Density, JJAP, 44(3), 2005, pp. 1181-1185.
Look et al., Identification of donors, acceptors, and traps in bulk-like HVPE GaN, J. Cryst. Growth, 281(1), pp. 143-150.
S. Porowski, "Near Defect Free GaN Substrates", MRS Internet, J. Nitride Semicond. Res 451, 1999, G1.3
M. Kelly et al., "Large Free-Standing GaN Substrates by Hydride Vapor Phase Epitaxy and Laser; Induced Liftoff", Japanese Journal of Applied Physics, vol. 38, 1999, pp. L217-L219.
K. Motoki et al., "Preparation of Large Freestanding GaN Substrates by Hydride Vapor Phase Epitaxy Using GaAs as a Starting Substrate", Japanese Journal of Applied Physics, vol. 40, 2001, pp. L140-L143.
Y. Melnik et al., "Properties of Free-standing GAN Bulk Crystals Grown by HVPE", Materials Research Society Symposium Proceedings, vol. 482, 1998, pp. 269-274.
H. Kim et al., "Preparation of 30×30 mm$^2$ Free-Standing GaN Wafer by Mechanical Liftoff and Optical Properties in the Backside of the Free GaN by Cathodoluminescence", Materials Research Society Symposium Proceedings, vol. 639, 2001, pp. G6.51.1-G6.51.6.
A. Fomin et al., "Properties of Si-Doped GaN Layers Grown by HVPE", Phys. Stat. Sol. (a) 188, No. 1, 2001, pp. 433-437.
A. Kasic et al., "Micro-Raman scattering profiling studies on HVPE-grown free-standing GaN", Phys. Stat. Sol. (a) 201, No. 12, 2004, pp. 2773-2776.
J. Niklas et al., "GaAs wafer mapping by microwave-detected photoconductivity", Materials Science & Engineering B80, 2001, pp. 206-209.
E. Schubert et al., "Optical properties of Si-doped GaN", Applied Physics Letter, 71 (7), 1997, pp. 921-923.
A. Usikov et al., "Lattice constant variation in GaN:Si layers grown by HVPE", Materials Research Society Symposium Proceedings, vol. 741, 2003, pp. L3.41.1-L3.41.6.
M. Yoon et al., "Free Carrier Concentration Gradient along the c-Axis of a Freestanding Si-doped GaN Single Crystal", Japanese Journal of Applied Physics, vol. 44, No. 2, 2005, pp. 828-831.
Y. Huang, "Spatial characterization of a 2 in GaN wafer by Raman spectroscopy and capacitance-voltage measurements", J. Phys. D: Appl. Phys. 37, 2004, pp. 2814-2818.
V. Chaldyshev et al., "Micro-Raman investigation of the n-dopant distribution in lateral epitaxial overgrown GaN/sapphire", Abstract, Journal of Electronic Materials 31, 2002, pp. 631-634.
K. H. Kim et al., "Growth and doping of AlGaN and electroluminescence of SAG-InGan/AlGaN heterostructure by mixed-source HVPE", phys. stat. sol. (c) 3, No. 6, 2006, pp. 1461-1465.
F. Scholz, U.S. PTO Notice of Allowance, U.S. Appl. No. 11/835,669, dated Mar. 12, 2014, 8 pages.

* cited by examiner

US 9,461,121 B2

PROCESS FOR THE MANUFACTURE OF A DOPED III-N BULK CRYSTAL AND A FREE-STANDING III-N SUBSTRATE, AND DOPED III-N BULK CRYSTAL AND FREE-STANDING III-N SUBSTRATE AS SUCH

CROSS-REFERENCE TO RELATED PATENT APPLICATIONS

This application is a divisional of U.S. application Ser. No. 11/835,669, filed Aug. 8, 2007, now issued as U.S. Pat. No. 8,778,078, and which claims priority from Provisional Application U.S. Application No. 60/836,370, filed Aug. 9, 2006. U.S. application Ser. No. 11/835,669 is also a continuation of International Patent Application PCT/EP2006/007894, filed Aug. 9, 2006. The entire contents of each forgoing application, including the specification, drawings, claims and abstract, are incorporated herein by reference.

BACKGROUND OF THE INVENTION

The present invention relates to a process for producing doped III-N bulk crystals from a gas/vapor phase, as well as to a process for producing free-standing doped III-N substrates which are obtained from the doped III-N bulk crystals. Here, the term N denotes nitrogen and III denotes at least one element of group III of the periodic system, selected from aluminum, gallium and indium (in the following sometimes abbreviated by (Al,Ga,In)). The invention further relates to doped III-N bulk crystals and free-standing doped III-N substrates obtained by such process. These free-standing doped III-N substrates are well-suited for the manufacture of optic and optoelectronic devices.

Conventionally in the commercial use, devices for (Al,Ga,In) N-based light emitting or laser diodes essentially had been grown on foreign substrates such as $Al_2O_3$ (sapphire) or SiC.

The disadvantages caused by the use of the foreign substrates with respect to crystal quality and correspondingly lifetime and efficiency of the devices may be coped with only by growing on free-standing III-N-, such as e.g. (Al,Ga)N-substrates. The latter, however, are hardly available in sufficient quality up to now. The reason for this essentially resides in difficulties of conventional bulk growing technologies owing to the extremely high steady-state vapor pressure of nitrogen above III-N compounds at typical growth temperatures.

The growth of bulk material under high pressure had been described by Porowski (MRS Internet J. Nitride Semicond. Res 4S1, 1999, G1.3). This process leads to a qualitatively valuable GaN bulk material, but has the disadvantage that, up to now, only small GaN substrates having an area of maximally 100 $mm^2$ can be produced. In addition, the manufacturing process, in comparison with other processes, requires a lot of time and, due to the extremely high growth pressures, is technologically laborious.

Another method resides in the growth of III-N material on a foreign substrate from the gaseous/vapor phase with a subsequent separation from the foreign substrate.

For producing thick, free-standing layers of such as GaN, it is e.g. known from the publication "Large Free-Standing GaN Substrates by Hydride Vapor Phase Epitaxy and Laser-Induced Liftoff" by Michael Kelly et al. (Jpn. J. Appl. Phys. Vol. 38, 1999, pp. L217-L219) to separate, from a sapphire substrate, a thick GaN layer previously grown on the sapphire ($Al_2O_3$) substrate by means of hydride vapor phase epitaxy (HVPE). In this connection, it is described to irradiate the GaN-coated sapphire substrate by means of a laser, whereby the GaN layer is thermally decomposed locally at the interface to the sapphire substrate and thereby released from the sapphire substrate. Alternative releasing methods consist of wet chemical etching (for example of GaAs: K. Motoki et al., Jap. J. Appl. Phys. Vol. 40, 2001, pp. L140-L143, dry-chemical etching (for example of SiC; Yu. Melnik et al., Mat. Res. Soc. Symp. Proc. Vol. 482, 1998, pp. 269-274), or mechanical lapping (for example of sapphire; H.-M. Kim et al., Mat. Res. Soc. Symp. Proc. Vol. 639, 2001, pp. G6.51.1-G6.51.6) of the substrate.

The disadvantage of the described methods resides, on the one hand, in the relatively high costs owing to laborious technologies for the substrate release, and on the other hand in the basic difficulty to produce III-N material having a homogeneously low defect density.

The growth of thick III-N hulk crystals (boules) on III-N substrate b) means of vapor phase epitaxy with subsequent individualization of the bulk crystal by a sawing process offers an alternative to the aforementioned processes.

Such a process has been described by Vaudo et al. (U.S. Pat. No. 6,596,079). As a preferred growing method the HVPE was chosen; as preferred boule crystal length, values of >1 mm, 4 mm or 10 mm had been mentioned. Vaudo et al. further described, inter alia, how to obtain III-N substrates from the bulk crystal by means of wire sawing or other treatment steps, for example chemical-mechanical polishing, reactive ion beam etching or photo-electrochemical etching. In an international patent application of Vaudo et al. (WO 01/68955 A1), III-N bulk crystals and substrates produced by means of the described technology are further mentioned.

Melnik et al. describe a process for growing GaN-(U.S. Pat. No. 6,616,757) or AlGaN-bulk crystals (US 2005 0212001 A1) having crystal lengths greater than 1 cm. There, the process consists of the basic steps: growth of a single-crystalline (Al)GaN layer on a substrate, removal of the substrate, and growth of the (Al)GaN bulk crystal on the single-crystalline (Al)GaN layer. As the preferred method, HVPE process with a specific reactor structure is mentioned. In addition, Melnik et al. describe, in a US application (US 2005 0164044 A1) or in U.S. Pat. No. 6,936,357, GaN or AlGaN bulk crystals having various properties, such as, for example, sizes, dislocation densities or full widths at half maximum (half widths) of X-ray diffraction curves.

Besides the crystallinity, the electrical properties of semi-conductor crystals must also be adapted to the needs of the respective uses. The properties of semiconductor crystals, in particular the electrical properties, can be controlled by the incorporation of foreign atoms, so-called dopants. By the concentration of dopants in a crystal, the concentration of charge carriers and thus the specific electric resistivity can be controlled. For opto-electronic devices, conducting substrates are used in order to allow a contact of the devices through the back-side of the substrate. In the case of GaN or AlGaN substrates, typically an n-doping is chosen, i.e., the incorporation of foreign atoms which generate mobile electrons. For example, a usual dopant for (Al)GaN is silicon. A p-doping is also possible, i.e., the incorporation of foreign atoms which generate holes. i.e., defect electrons. For example, a usual dopant for (Al)GaN is magnesium. Another possibility is represented by the incorporation of foreign atoms which act as low-energy defect sites and thus bond mobile charge carriers and thereby reduce the conductivity of the crystal. For (Al)GaN, this is, for example, possible by iron.

In vapor phase epitaxy, the dopants are typically provided in the form of gaseous compounds. For example, silane, $SiH_4$, can be used for silicon, bis(cyclopentadienyl)magnesium, $Mg(C_5H_5)_2$, for magnesium, and bis(cyclopentadienyl)iron, $Fe(C_5H_5)_2$, for iron.

For example, Manabe et al. (U.S. Pat. No. 6,472,690) describe the n-doping of GaN by feeding a silicon-containing gas. Usikov et al. (Mat. Res. Soc. Proc. Vol. 743, L3.41.1) describe the n-doping by feeding silane with the HVPE. There is no mention about the homogeneity.

Vaudo et al. (US publication 2005/0009310 A1) describe semi-insulating GaN crystals having a doping with low acceptors. In the description, metal-organic compounds are mentioned as dopants.

For HVPE growth, chlorine-containing compounds such as dichlorosilane, $SiCl_2H_2$, may also be used. Usui et al. (JP 3279528 B) describe doping with $SiH_xCl_{(4-x)}$.

The generation of the chloride compound of the dopants in the HVPE process may be carried out, analogous to the generation of GaCl, in situ by the reaction of the elemental dopant with HCl. Thus, the gaseous doping substances may be generated in the reactor via additional gas pipelines in connection with corresponding additional crucibles with the respective elemental starting materials. This process is, for example, described by Fomin et al. (phys. stat. sol. (a) Vol. 188, pp. 433). Hong et al. (U.S. Pat. No. 6,177,292) mention this procedure, in order to produce an n-doped GaN layer on a polished GaN substrate. Nikolaev et al. (U.S. Pat. No. 6,555,452; corresponding to US 2002/28565 A) describe the p-doping by the inclusion of a metallic dopant such as Mg or Zn into an additional source region separated from the III-starting material. This process requires a complex enlargement of gas feedings and sources within the reactor.

SUMMARY OF THE INVENTION

The present invention is based on the object to provide a process for producing doped III-N crystals and in particular doped III-N bulk crystals, and to provide correspondingly obtainable doped III-N substrates having good crystal quality and a homogeneous distribution of the dopants in the growth direction and/or in the plane perpendicular thereto.

According to a first aspect of the invention, a process for the production of a doped III-N crystal and in particular a doped crystalline III-N layer, or of a doped III-N bulk crystal is provided, wherein III denotes at least one element of the main group III of the periodic system, selected from Al, Ga and In, wherein the doped III-N bulk crystal is deposited on a substrate or a template, and wherein the feeding of at least one dopant into the reactor is carried out together and in admixture with at least one III-material.

According to the invention, a surprisingly homogeneous incorporation of dopants into the crystalline III-N layer or into the III-N bulk crystal can be achieved. The common, mixed feeding of the at least one dopant with the at least one III-material is carried out suitably through the same feed line. The mixed feeding is carried out most effectively, above all with an HVPE process, in such a manner that the at least one dopant and the at least one III-material derive from the same source and are thereby fed commonly into the reactor. The particularly homogeneous incorporation of the dopant into the crystalline III-N layer or into the III-N bulk crystal can be achieved especially when the dopant is added directly into the boat or well of the group III material. In addition, a particularly homogeneous incorporation can be achieved when the at least one dopant is given in advance in elemental form and with the at least one group III starting material in elemental form as a mixture. The mixture may suitably be provided as a solid solution, or as a common melt, in particular in the form of an alloy. According to preferred embodiments, it is made feasible that species of the at least one dopant and the at least one III-material are transferred in an advantageous manner commonly into the gas phase, and then are fed into the reactor.

According to a particular embodiment of the invention, a process for producing a doped crystalline III-N layer or a doped III-N bulk crystal is provided, wherein III denotes at least one element of main group III of the periodic system, selected from Al, Ga and In, wherein, in a reactor for hydride vapor phase epitaxy (HVPE), a common source and/or a common feed line is/are provided in the HVPE reactor for the group III-starting material and the dopant, and a halide reaction gas is introduced into the common source and/or the common feed line such that a mixture of halides of the group III-starting material and the dopant is formed, and the mixture is fed to a growth region of the HVPE reactor, and wherein an N-starting material is introduced into the HVPE reactor, whereby the doped crystalline III-N layer or the doped III-N bulk crystal is formed with a homogeneous incorporation of the dopant into the III-N crystal.

According to another particular embodiment of the invention, a process for producing a doped crystalline III-N layer or a doped III-N bulk crystal is provided, wherein III denotes at least one element of main group III of the periodic system, selected from Al, Ga and In, wherein the process comprises the following steps: providing a solid solution, an alloy or a mixed melt, respectively containing the element of the main group III of the periodic system and the element of the dopant for the III-N material of the crystalline III-N layer or the doped III-N bulk crystal; contacting the provided alloy with a reaction gas for the formation of mixed products from the group III element and the dopant respectively with a component of the reaction gas in vapor phase; contacting the thus formed mixed products with an N-starting material in the vapor phase; and depositing crystalline III-N layer or III-N bulk crystal with dopant being respectively incorporated.

The reaction gas typically comprises HCl and/or another chloride, optionally mixed with carrier gas, for the formation of mixed products comprising the chlorides of the group III-element and of the dopant.

Thus, in the process according to the invention a dopant and the starting materials for the crystal growth, particularly the group III component which strongly affects the growth rate, are not fed separately—typically via separated feed lines—to the growth region like in the above-mentioned prior art. Rather, in the mode of operation according to the invention, a mixture of at least the selected dopant and at least the selected group III starting material is present already when entering the reactor. Most suitably, one feed line is common for a dopant and a group III starting material, optionally for partial amounts of dopant and/or group III starting material only. In particular, the at least one dopant and the at least one group III starting material are provided together in a common pipe for source material, and even more preferred, both are provided commonly in a source boat/well or a source container, above all as a mixture of respective elemental forms. It is particularly advantageous and thus preferred, if the at least one dopant and the at least one group III starting material are provided in advance as solid mixed solution or as mixed melt, above all as an alloy. By the mode of operation according to the invention, conditions can be created, whereby the concentration of the group III source material and the dopant source are evenly distributed over the growth plane, and whereby the same ratio of group III material to dopant always exists at a certain point of time all over the growth front. Local variations across the growth plane can be avoided. Consequently, a very high homogeneity of the incorporation of dopants can be obtained according to the invention. This is contrary to a varying distribution in the mode of operation according to the prior art, where the proper source material for the growth and the incorporation of the dopant are provided separately and mutually independently. The thicker the respectively epitaxially grown layers, the more significant is the effect of the difference between the mode of operation of the invention compared to that of the prior art. While the process of the prior art may yet be acceptable for the preparation of thin doped layers, they are unsuited for the homogeneous doping of thick crystals. According to the invention, the very homogeneous doping within the crystal can be achieved, even at relatively thick III-N bulk crystals of e.g. at least 1 mm and even of at least 1 cm and, particularly advantageously, of at least 3 cm. To this end, a deposition by means of vapor phase epitaxy in a vapor phase epitaxy reactor, and above all the use of hydride vapor phase epitaxy (HVPE) is particularly effective according to the invention, because, thereby, an advantageous high growth rate of, for example, about 50 to about 1000 μm/h, preferably of about 200 to about 750 μm/h can be chosen for achieving such thick III-N bulk crystals, while a homogeneous incorporation of dopants is yet realizable at the same time. In addition, the technical complexity can be simplified in the process according to the invention in comparison with the conventional technique, which in turn facilitates the controllability of doping. While in the prior art, separate feed lines have to be provided for the dopants by separate control and adjustment techniques (valves, mass flow controller), control and adjustment techniques can be shared for the dopant source and for the proper III source material according to the invention.

The present invention and its particular objects, features and advantages will be explained in the following in more detail by means of preferred embodiments, drawings and examples, which, however, are for illustrative purposes only and shall by no means be understood in a limitative manner.

Further objects, features and advantages of the present invention will become apparent from the detailed description of preferred embodiments that follows, when considered together with the accompanying figures of drawing.

DETAILED DESCRIPTION OF THE PREFERRED EMBODIMENTS

Figure 1:
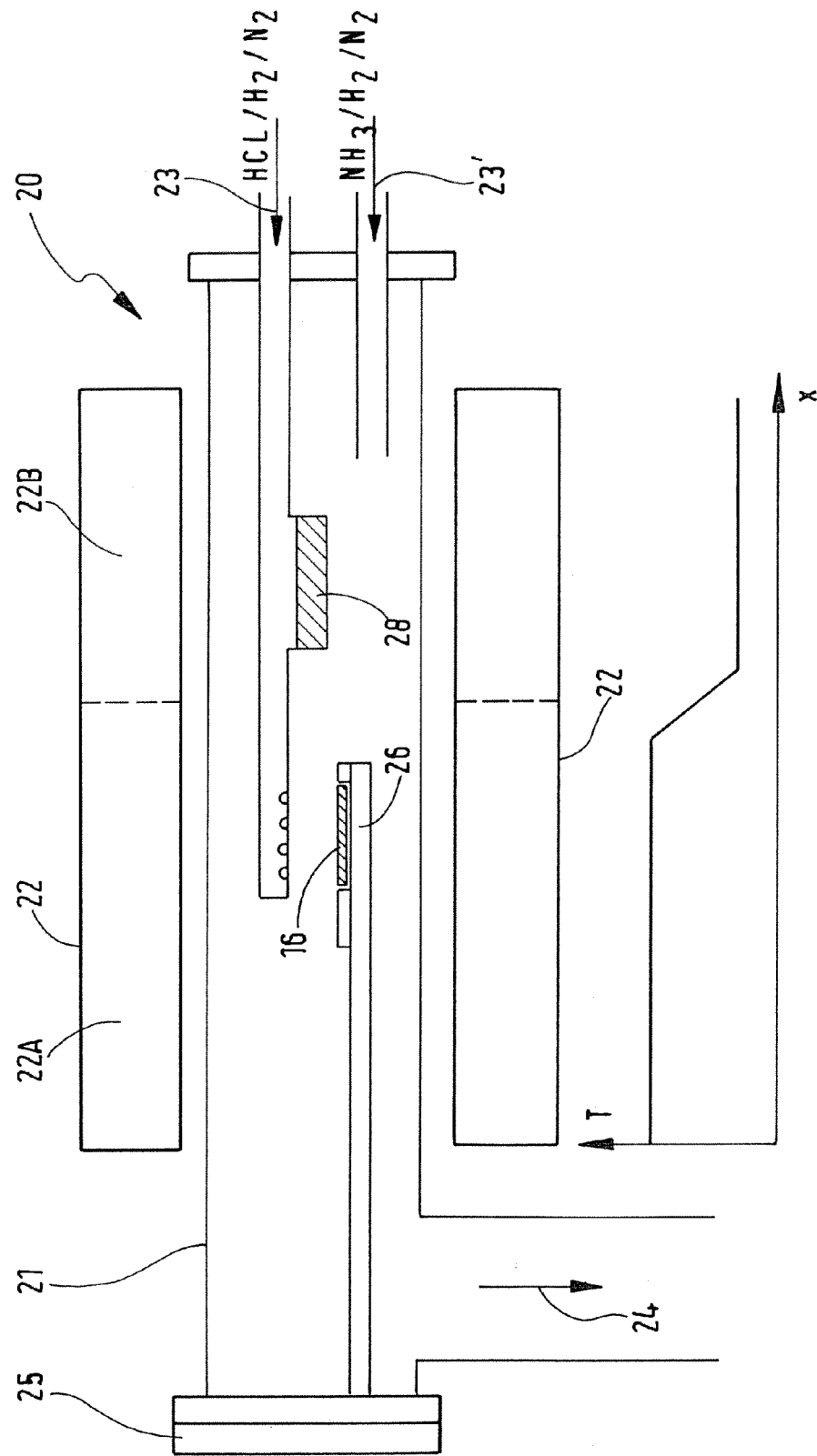
FIG. 1 schematically shows a basic structure of a HVPE, apparatus in cross-section, to which the present invention is applicable.

The group III source material is provided/charged in advance in elemental form within the reactor of HVPE. HCl is directed above the liquid material at elevated temperature, for example, in the range of 800 to 900° C., it reacts to become a chloride compound which is then directed to the growth region. The dopants are charged directly into the source material and dissolve there at a certain ratio. Once HCl is directed above the source, both chloride compounds of the group III material as well as of the dopant are formed. These are directed, in an adjustable predetermined ratio of group III material to dopant, together in one feed line towards the growth region and also impact together onto the crystal surface. The HCl flow above the melt concurrently controls the growth rate of the crystal and the doping. Hence, essentially the same ratio of group III material and dopant practically exists always. The doping within the crystal is thus independent from the growth rate and proceeds entirely homogeneously. The ratio of group III material to dopant depends on the dopant concentration in the common melt and on the different kinetics of chloride formation of the respective materials. Differences in the reaction kinetics may lead to a different concentration of the dopant within the melt and within the gas stream, respectively; for a given concentration in the melt, the concentration in the gas stream is, however, always constant.

As a possibility for adjustment, an excess amount of dopant, i.e., an amount exceeding the solubility limit of the dopant in the group III material, may be added to the group III source material. Furthermore, the proportion in the melt and, thus, the dopant concentration within the crystal may be influenced by the solubility limit of the dopant in the group III material. The maximal solubility is dependent on temperature, thus the doping of the crystal may be adjusted via this mechanism by the temperature of the melt. If the dopant has a density lower than that of the group III source material, an excess amount of the dopant insoluble in the group III melt may be anchored constructionally in the melt such that it would not float on the group III material and would come in direct contact with the HCl gas. An anchoring may be realized, for example, by a grid being present in the boat/well to be immersed within the melt of the group III material. If desired, a mechanic mixing device, e.g. a stirrer or an agitator, may be provided for mixing the group III element and the dopant in the melt.

According to another aspect of the invention, the dopant concentration of the doped crystal is adjusted by means of the amount of dopant added into the source. The maximal concentration is physically predetermined by the solubility limit; however, the dopant concentration may be reduced as desired by the addition of lower amounts of the dopant. By this method, the dopant concentration may be adjusted throughout the crystal in an easy manner.

As a further adjustment possibility, mixed additions may be performed not only through a common source or feed line, but from multiple common sources, or a combination of (i) a mixed addition from a common source or feed line with (ii-1) one or more further mixed additions from a common source or feed line or with (ii-2) one or more separate additions of the group III material alone and/or the dopant alone may be carried out.

By means of the adjustment possibilities described above, homogeneously distributed dopant amounts may be adjusted as demanded or desired in a variable and flexible manner over a broad to narrow amount region within the doped III-N crystal. Suitable exemplified concentrations are within the range of from $1\times10^{16}$ to $1\times10^{21}$ cm$^{-3}$ and in particular $1\times10^{17}$ to $1\times10^{19}$ cm$^{-3}$ dopant within the obtained crystal, without however being limited thereto in any way.

Figure 2:
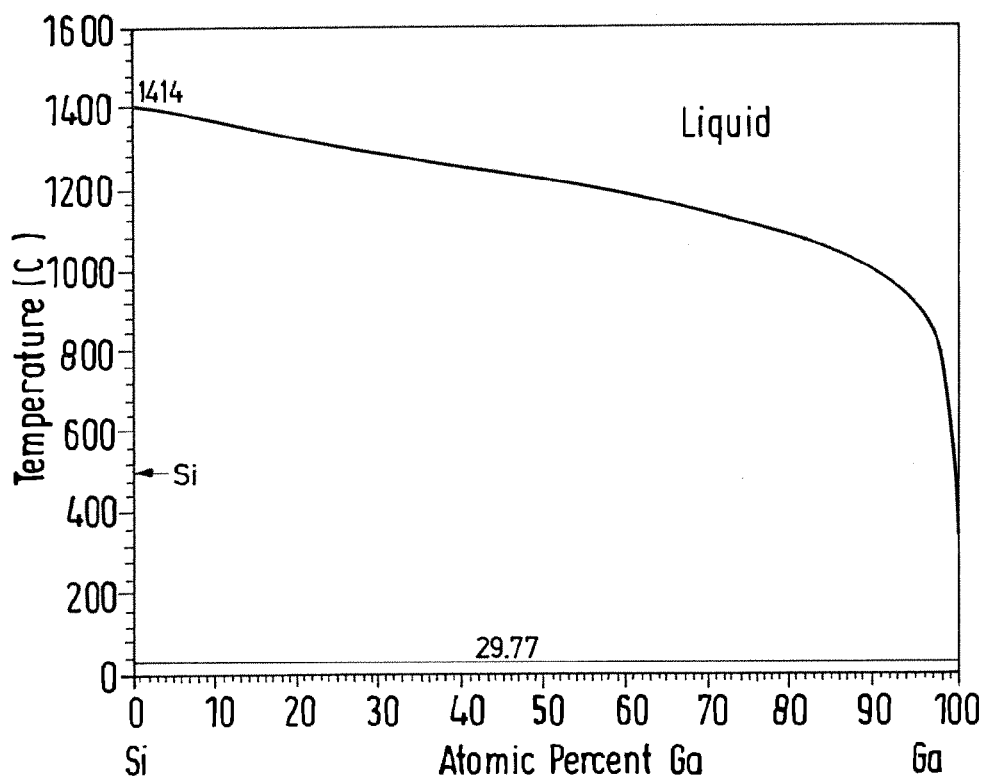
FIG. 2 shows the phase diagram of the alloy gallium silicon, which can be used in one embodiment of the present invention.

As an example, the solubility diagram of silicon in gallium is illustrated in FIG. 2. From this, it can be gathered that the solubility limit of silicon in gallium lies at about 2% at a possible operating temperature for the inflow of the group III material, i.e., at e.g. about 850° C. That is, such a mixture or alloy of up to maximally 2% Si as dopant in Ga as group III material allows a homogeneous doping of the crystals without constructive enlargement of the reactor and thus results in better results without additional effort.

Furthermore, it can be gathered from FIG. 2 that at another temperature, e.g., at a possible operation temperature for the inflow of the group III material of about 900° C., the solubility limit of silicon in gallium lies at about 3%. Thus, by a mere change of the operation temperature, the ratio of the dopant Si to the group III material Ga and thus the ratio of Si to Ga within the III-N crystal may be varied.

On demand, e.g., if still higher amounts of a dopant are desired, still a further, separate inflow of dopant alone may be accomplished. In such a case, too, the homogeneity of the dopant incorporation within the III-N bulk crystal is improved overall due to the at least partial mixed inflow of dopant and group III material.

Figure 3:
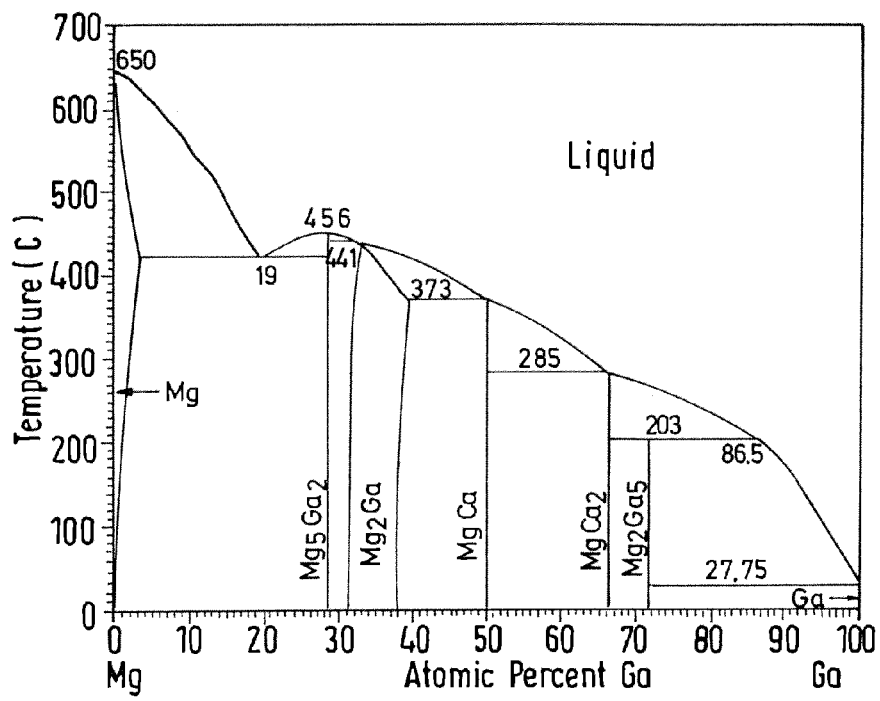
FIG. 3 shows the phase diagram of the alloy gallium magnesium, which can be used in another embodiment of the present invention.

FIG. 3 shows the phase diagram or the alloy gallium-magnesium. At 850° C. any desired concentration of magnesium can be dissolved in gallium.

Figure 4:
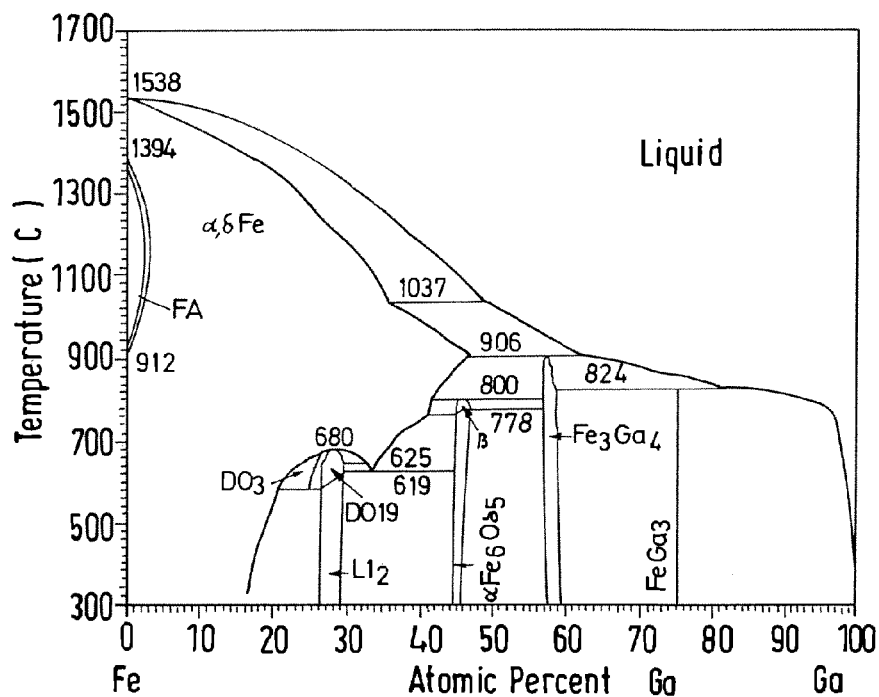
FIG. 4 shows the phase diagram of the alloy gallium iron, which can be used in still another embodiment of the present invention.

FIG. 4 shows the phase diagram of the alloy gallium-iron. At 850° C., the solubility limit of iron in gallium lies at about 18%. Depending on the temperature chosen, the solubility limit of iron in gallium is variably adjustable.

Phase diagrams for other mixture or alloy systems of dopant and group III material usable according to the invention may be depicted from corresponding physics reference books.

According to a further aspect of the invention, two sources may be operated in parallel. In one source, a group III material is provided without dopant, and in another source, preferably the same group III material, optionally alternatively or additionally another group III material, respectively comprising a high concentration of the desired dopant—optionally in the region of the solubility limit—are provided commonly. In this manner, a variable apportionment of the HCl flow towards the two sources allows a fine adjustment and/or, if desired, a change of the incorporated dopant concentration. The gas streams from both sources may subsequently be directed to the growth region through a common gas inlet, in order to further diminish inhomogenities.

A further variation resides in that a further feeding of an additional, separate source of dopant, alone or in mixture with the same or another group III material, is carried out.

According to the invention, one or more dopant species may be used, and/or one or more species of the group III material may be used. There are no limits, neither with respect to the usable dopants nor with respect to the usable group III source materials. For example, one or more dopant(s) selected from the group of Si, Ge, Sn, O, S, Se, Be, V, Mg and Te, and/or one or more dopant(s) selected from the group consisting of Mn, Zn, Cr, Co, Ni, Cu and Fe are suitable, alone or in combination. Thereby, III-N compound crystals of n-type, p-type and i-type in bulk, as well as, after suitable individualization, free-standing doped III-N compound crystal substrates of corresponding types may be produced as desired and as demanded. As the dopant, Si, Te, Mg and Fe are particularly preferred. The used dopant(s) may be provided in advance commonly as a mixture and particularly as an alloy with the at least one group III material, or the mixture or alloy may be formed in situ during the process according to the invention when forming the common melt of dopant and III material.

The III-N compound is advantageously single-crystalline.

In preferred embodiments of the invention, the epitaxial growth of the doped III-N bulk crystal is carried out directly on a hetero substrate (foreign substrate) or on a homo substrate (native substrate). In advance of the growth of the doped III-N bulk crystal, one or more intermediate layers may be deposited, preferably of III-N material, the composition of which may be chosen independently from that of the III-N bulk crystal. Process, technique and/or device for depositing the intermediate layer can be freely chosen.

In a preferred development of the invention, a III-N substrate having a c-, a-, m- or r-plane as the growth plane is used as a III-N substrate, and the doped III-N bulk crystal is deposited on the chosen growth plane.

In a preferred development of the invention, a III-N substrate with a growth plane having a misorientation of 0.1-30° towards a c-, a-, m- or r-plane is used, and the doped III-N bulk crystal is deposited thereon.

In a preferred development of the invention, single-crystalline sapphire, silicon carbide, gallium arsenide, lithium aluminate or silicon is used as the substrate, and a doped III-N bulk crystal is deposited thereon. In a particularly preferred development, a doped or non-doped GaN substrate is used, and a doped GaN bulk crystal is grown. Further preferably, the doping of the GaN substrate corresponds to the doping of the GaN bulk crystal grown thereon.

In a preferred development of the invention, the grown doped III-N bulk crystal has an almost circular cross-section in the plane of the main surface, wherein certain structural elements such as flats or notches may optionally be possible always, and it has a diameter of ≥5 cm. The length of the grown III-N bulk crystal preferably is ≥1 mm, further preferably ≥1 cm and particularly ≥3 cm or more.

Among others, a particular advantage is that, by the present invention, a unique homogeneity of the dopant concentration, particularly in the growth plane perpendicular to the growth direction, can be provided with these advantageous dimensions of the grown III-N bulk crystal and thus the individualized, free-standing III-N substrate produced thereby.

After carrying out the process according to the invention, free-standing, doped III-N crystal substrates may be produced by separating one or more III-N substrates from the doped III-N bulk crystal. A particularly suitable method of separation is wire sawing. Further treatment steps may follow subsequently, particularly, for example, lapping, polishing, annealing and/or one or more final cleaning steps.

Further variations and combinations of the aspects and developments of the invention described above may be readily possible.

According to another aspect of the invention, a III-N bulk crystal obtainable by the process according to the invention is provided. Preferably, it is produced by the above-defined aspects of the invention and optionally according to the above-mentioned preferred embodiments. For doping the III-N bulk crystal of the invention, dopant is actively incorporated within the III-N compound crystal. Significant parameters for the homogeneity of the III-N bulk crystal realizable according to the invention, and correspondingly, the free-standing doped III-N substrate obtainable by individualization from the bulk crystal (to be described later), are alone or in combination: a homogeneity of the charge carrier concentration measurable by frequency locations of the LPP$^+$ mode in a micro-Raman mapping; a homogeneity of the specific electric resistivity measurable by photoconductivity signals in a MDP mapping; and a homogeneity of the dopant concentration measurable by a line width of the D$^0$X transition in a micro-photoluminescence mapping. In addition, the group III-N bulk crystal and the free-standing doped III-N substrate according to the invention are characterized by a unique combination of one or more of the aforementioned homogeneity parameters with a good crystal quality in spite of the doping, measurable by full widths at half maximum (half widths) of the characteristic E$_2$ phonon. The mentioned parameters with respect to homogeneity and crystal quality will be subsequently described in more detail.

The material parameter of specific electric resistivity and charge carrier concentration are dependent on the dopant concentration. The specific resistivity is usually determined by means of van-der-Pauw measurements or eddy current measurements, and the charge concentration by Hall measurements or CV measurements. Basically, an evaluation of the distribution of the dopant concentration is possible by these measurement methods; however, they always average over the measured part of a sample, and a mapping with multiple measurement points is less practicable. The charge carrier concentration may, however, be determined also by micro-Raman measurements via the position of the upper branch of the LO-phonon-plasmon coupled mode (LPP$^+$) of E$_1$ symmetry (Kasic et al., phys. stat. sol (a) 201 (2004), p. 2773; Yoon et al., Jpn. J. Appl. Phys. 44, p. 828). The unique homogeneity of the dopant concentration of the doped III-N bulk crystal according to the invention and the individualized and free-standing doped III-N substrate, that is correspondingly separated therefrom, thus may be defined particularly by micro-Raman mappings.

Thus, in a micro-Raman mapping of the III-N bulk crystal of the invention on a plane
(i) parallel to the growth plane and/or
(ii) in the growth direction,
the standard deviation of the respectively measured charge carrier concentration, measurable by the frequency positions of the LPP$^+$-mode,
in case of (i) is 5% or lower, preferably 3% or lower, further preferably 2% or lower,
in case (ii) is 10% or lower, preferably 7.5% or lower, further preferably 5% or lower.

The standard deviation may be determined by carrying out micro-Raman measurements, respectively, at the plurality of, e.g., 100 measurement points of the plane (i) or (ii) to be measured, forming the mean value of the frequency locations of the LPP$^+$-modes, and determining the standard deviation relative to this mean value by usual statistical evaluation. Since in case (ii) the separation of a wafer plane in the growth direction of the bulk crystal is less practical, one suitably proceeds such that, firstly, a plurality of wafers respectively having a plane that is perpendicular to the growth direction are separated from the bulk crystal. e.g., as in the usual preparation of wafers by wire sawing transverse the longitudinal direction of the bulk crystal, then carrying out respective micro-Raman mappings as mentioned above at the plurality of e.g., 100 measurement points, and subsequently determining the standard deviation of the mean values of the frequency locations respectively determined on the separate wafers. If in control measurements, there is a deviation in a sample of the material in comparison with the previously mentioned direct measurement of the standard deviation in the growth direction, the direct measurement in the growth direction is valid due to higher accuracy.

A method for detecting the homogeneity of the specific electric resistivity and thus of the doping concentration is represented by wafer mapping by means of microwave-detected photoconductivity measurements (MDP) (J. R Niklas et al., "GaAs Wafer Mapping by Microwave-detected Photoconductivity", Materials Science and Engineering B 80 (2001) 206). Thus, analogous to Raman mapping, the standard deviation of the MDP signal in the mapping on a plane parallel to the growth plane is a measure for the homogeneity of the doping concentration in the growth plane. The homogeneity perpendicular to the growth plane may again be gained either by mapping on a plane within the growth direction, or by the standard deviation of mean values which had been determined from separate wafers obtained from the bulk crystal, wherein the latter method is more practicable and thus preferred. Again, in case of deviations, the direct measurement within the growth direction prevails due to higher precision.

In the MDP mapping, values of standard deviations of the photo conductivity signals corresponding to those described above with respect to raman mapping according to the invention.

Another alternative method for detecting the homogeneity of the dopant concentration and thus of the electric properties is represented by wafer mapping by means of micro photoluminescence measurements (Schubert et al., Appl. Phys. Lett. 71, pp. 921 (1997)). The intensity and the line width of the transition of the donor-coupled excitons (D$^0$X) are a measure for the dopant concentration. Thus, analogous to the previously described measurement methods, the standard deviation of the photoluminescence-D$^0$X-intensity as well as the standard deviation of the photoluminescence-D$^0$X-line width in the mapping of a plane parallel to the growth plane are a measure for the homogeneity of the doping concentration within the growth plane. The homogeneity perpendicular to the growth plane again can be gained either by mapping on a plane within the growth direction, or by the standard deviation of mean values which had been determined from separate wafers obtained from a bulk crystal, wherein the latter method is more practicable and thus preferred. In case of deviations, again the direct measurement in the growth direction prevails due to higher precision.

In the micro photoluminescence mapping, values of the standard deviations of the line widths of the D$^0$X transition corresponding to those of the above-described Raman mapping can be achieved.

In the doped III-N bulk crystal provided according to the invention, the aforementioned homogeneity parameters may be respectively realized individually: preferably the single parameters are combined.

By the separation from prepared, doped III-N bulk crystals, single free-standing doped III-N substrates having the respective homogeneous doping can be obtained.

Correspondingly, a free-standing doped III-N substrate is provided according to the invention, wherein with respect to a homogeneity parameter, selectable from the group of homogeneity of the charge carrier concentration, homogeneity of the specific electric resistivity and homogeneity of the dopant concentration, on a plane
(i) parallel to the growth plane and/or
(ii) in the growth direction,
the standard deviation of the respectively measured parameter, i.e., selected from the frequency location of the LPP$^+$-mode in the micro-Raman mapping, the photoconductivity signal in the MDP-mapping, and the line width a the $D^0X$-transition in the micro photoluminescence mapping, in case (i) is 5% or lower, preferably 3% or lower and further preferably 2% or lower, in case (ii) is 5% or lower, preferably 3% or lower and further preferably 2% or lower.

In addition, the homogeneous and controlled incorporation of the dopant enables that, according to the invention, a very good crystal quality is provided over the entire growth plane and within the whole bulk volume, i.e., in the growth direction, too.

The standard deviations of the frequency and particularly of the full width at half maximum (half-width) of the $E_2$-phonon in a scan on a plane parallel to the growth plane or in the growth direction are measures for the homogeneity of the crystal quality parallel to the growth plane or in the growth direction, respectively. The homogeneity of the crystal quality of the bulk crystal in the growth direction again can be determined preferably by means of the standard deviation of the mean values of the full widths at half maximum (half-widths) of the $E_2$-phonon of the separate substrates which had been obtained from the corresponding bulk crystal. The full widths at half maximum (half-widths) of the $E_2$-phonon may be determined through micro-Raman measurements, e.g. as described by Kasic et al., phys. stat. sol (a) 201 (2004), pp. 2773.

Thus, in a III-N bulk crystal of the invention and in a free-standing III-N substrate of the invention, in a micro-Raman mapping on a plane (i) parallel to the growth plane and/or (ii) in the growth direction, the standard deviation of the measured full widths at half maximum (half-widths) of the $E_2$-phonon, due to the excellent crystal quality, in case (i) is 5% or lower, preferably 3% or lower, further preferably 2% or lower.

in case (ii) is 5% or lower, preferably 3% or lower, further preferably 2% or lower.

Concerning the micro-Raman mapping measurements, reference is made to the description above.

In the following, preferred embodiments and examples of the invention will be described, which, however is not to be understood in a limitive manner. Rather, they serve merely for the illustration of the invention, and variations and modifications which are possible within the framework of the appended claims will become apparent to the person skilled in the art.

In a HVPE apparatus, a small amount of dopant, e.g., silicon, is added to the group III material, e.g., gallium in the gallium source. The silicon concentration lies below 1%, i.e., in the easily controllable solubility region of Si in Ga. A foreign substrate or a III-N substrate is used as the starting or seed substrate, wherein a so-called template is also included as a possible substrate form where one or more intermediate layer materials is (are) deposited on a substrate, respectively, independent from material type and deposition method. Preferably, a III-N substrate is used, for example a GaN substrate having a diameter of >5 cm and a (0001) orientation, further preferably having a slight misorientation of the substrate surface towards the exact (0001) plane, for example, by 0.3 or 0.6 degrees.

When heating the reactor and the gallium source, the silicon is dissolved in the gallium. The temperature of the source during the growth lies in a range of 800° C. 900° C., hence silicon is completely dissolved. Before reaching the growth temperature (i.e., at a lower temperature), preferably ague atmosphere comprising one or more gases, yet at least an N-containing gas, preferably at least the three gases hydrogen, nitrogen and ammonia, may already be charged chronologically in advance. In particular, ammonia gas is charged for the stabilization of the surface. After reaching the growth temperature, the III-N bulk crystal growth is started by in-charging the hydrogen chloride inflow over or via the gallium source. This means, for example, in the case of the GaN bulk crystal growth, that hydrogen chloride gas reacts with the gallium silicon mixture, and thus gallium chloride and silicon chloride are generated. The ratio of gallium chloride to silicon chloride may deviate from the gallium/silicon ratio in the source owing to different reaction kinetics; however, the ratio in the vapor phase is proportional to the ratio in the melt. Gallium chloride and silicon chloride are then directed to the substrate, where they react with ammonia to become silicon-doped GaN. The silicon concentration in the crystal may thus be controlled by the silicon concentration in the source. The advantage of the incorporation of the dopant according to the invention resides in that, during a growth process, the same concentration of the dopant is always incorporated into the crystal, because the concentration is provided by the source. In addition, gallium and dopant are fed only in one pipe to the growth region, whereby a particularly homogeneous incorporation is enabled. On the other hand, if in a conventional doping the dopants and the group III material reached the growth region on separate routes, local variations would always occur on the growth front, and thus the ratio of dopant to group III and/or to N would be subject to local variations.

FIG. 1 schematically shows an example for the basic structure of an HVPE apparatus in cross-section, to which the present invention is applicable. The HVPE apparatus 20 includes a glass reactor 21, a multi-zone furnace 22 surrounding it, gas supplies 23,23' indicated by arrows and a pump and exhaust system 24 indicated by an arrow. The template 16 is introduced on a substrate holder 26 into the reactor 21 through the loading and unloading flange 25. With the pump and exhaust system 24, the reactor is then brought to the desired process pressure, suitable in the range of ≤1000 mbar, for example at about 950 mbar. The multi-zone furnace has a first zone 22A, which sets the growth temperature on the surface of the substrate, and a second zone 22B, which sets the temperature in the region of a Ga well/boat 28. Via the gas supply 23,23', $H_2$ and/or $N_2$ is/are made to flow into the reactor as carrier gas. For the in situ formation of gallium chloride and silicon chloride, the GaSi being present in the GaSi-well/boat is heated by adjusting a suitable temperature in the zone 22B of the multi-zone furnace 22, e.g., to about 850° C., and is reacted with HCl, which is made to flow in from the gas supply 23 with $H_2/N_2$ carrier gas in a suitable gas mixing ratio and with a suitable flow rate. The mixture of gallium chloride and silicon chloride generated in situ commonly flows out of apertures at the end of the inflow pipe 23 into the reactor 21 and is mixed there with $NH_3$, which is made to flow in from the inflow pipe 23' with an $H_2/N_2$ carrier gas mixture in an appropriate gas mixture ratio and with suitable flow rate for the adjustment of a desired $NH_3$ partial pressure of e.g., about 6 to $7\times10^3$ Pa. As will be clear from the temperature profile at the bottom of FIG. 1, a temperature which is higher than that of the zone 22B is established in the zone 22A of the multi-zone furnace 22, in order to set a substrate temperature of appropriately about 950-1100° C., e.g., around 1050° C. In this example, Si-doped GaN is deposited on the substrate holder.

Figure 5:
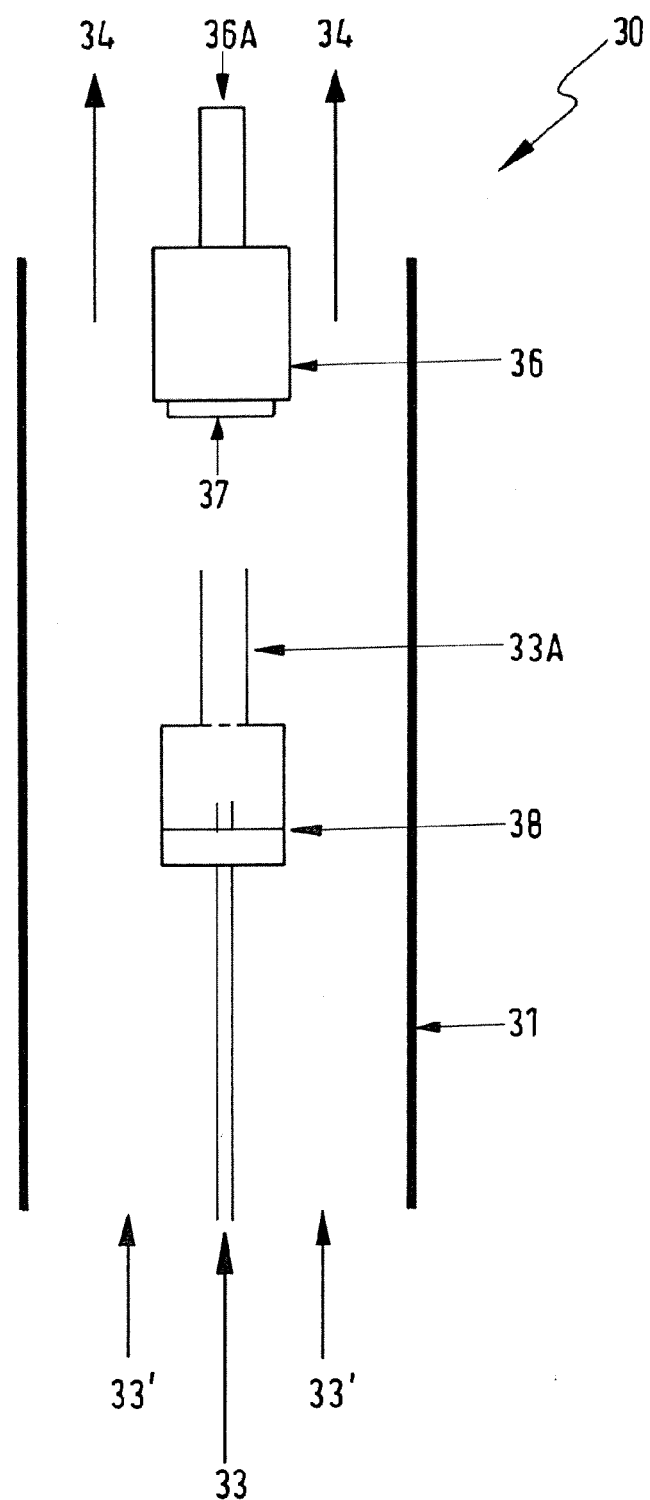
FIG. 5 schematically shows a basic structure of a vertical HVPE apparatus in cross-section, to which the present invention is applicable.

FIG. 5 schematically shows an example for the basic structure of a vertical HVPE apparatus in cross-section, to which the present invention is applicable, too. The vertical HVPE reactor 30 includes components which basically correspond to those of the horizontal structure of the HVPE apparatus 20 shown in FIG. 1, including a vertical reactor wall 31, a substrate or a template 37, which is held at a susceptor 36 and onto which the III-N hulk crystal is epitaxially grown. Around the reactor wall 31, a furnace (not shown), suitably a multi-zone furnace is provided for selective heating specific vertical portions of the reactor. The susceptor 36 itself is fixed onto a susceptor support 36A. Firstly, a gas feeding pipe 33 directs HCl and carrier gases (e.g., $H_2$ and $N_2$) into a container of source 38, in which the group III material gallium in admixture with the dopant Si are provided in advance. The mixture of the reaction gases containing gallium chloride and silicon chloride is subsequently directed, via the further feed pipe 33A, into the reactor. A gas feed for $NH_3$ and carrier gases (e.g., $H_2$ and $N_2$, see the two outer arrows 33 at the bottom) provide for an inflow of the N component of the III-N crystal. A gas stream outlet (see the outer arrows 34 at the top) discharges the exhaust gases.

Any modification and variation may be made both in the horizontal and in the vertical structure of the HVPE apparatus, as respectively shown in FIGS. 1 and 5.

If, instead of silicon, another dopant such as, for example, Te, Fe, Mg or Zn or a mixture of such dopants is selected, this dopant is added instead of silicon to the gallium. If, instead of a doped GaN layer, e.g., a doped (Ga,Al,In)N-, (Ga,Al)N- or (GaIn)N-layer is to be deposited, additional Al- and/or In-wells/boats or -containers and corresponding feed pipes are provided in the HVPE apparatus 20 or 30 (not shown in FIGS. 1 and 5). Depending on its solubility in the group III elements, the charging of the dopant may be carried out into one, or into different III-sources. The inflow of corresponding aluminium chloride and/or indium chloride into the reactor, for example, occurs by feeding HCl in appropriate carrier gas of e.g., $H_2/N_2$, as analogously shown in FIG. 1 with the feed pipe 23 or in FIG. 5 with the feed pipe system 33/33A for Ga.

In this manner, thick doped layers in the thickness region of e.g., 200 μm or higher, preferably in the range of from 300 to 30000 μm or higher may be obtained efficiently and with very good homogeneity of the doping.

The grown, doped III-N bulk crystal is individualized, preferably by wire sawing, typically after one or more process step(s) such as, for example, round grinding and orienting. Doped III-N substrates are suitably obtained after further process steps such as, for example, lapping, polishing, etch grinding, grinding of flats or notches, annealing as well as various final cleaning steps. Here, lapping and polishing steps normally are multiple-step processes.

Both the grown doped III-N bulk crystals and the III-N substrates obtained through the subsequent process steps now exhibit, thanks to the described incorporation of the dopant, an excellent homogeneity of the distribution of the dopant in the growth direction or also in the plane perpendicular thereto.

For example, this can be determined by means of micro-Raman measurements. Thus, the standard deviation of the frequency of the $LPP^+$-mode in a scan on a surface parallel to the growth plane or in growth direction, for example, is a measure for the homogeneity of the doping parallel to the growth plane or in the growth direction. The homogeneity of the doping of the bulk crystal in growth direction again can be determined preferably by means of the standard deviation of the mean values of the frequencies of the $LPP^+$-mode of the separate substrates obtained from the corresponding bulk crystal.

In a specific example, a GaN substrate having a diameter between 50 and 60 mm is transferred into an Aixtron LP-HVPE reactor. The group source is charged with gallium, to which 0.1% silicon is added. A bulk doped GaN crystal having a thickness of several mm is grown on the substrate. The HVPE process takes place, for example, at a temperature of 1040° C. to 1075° C. and at a pressure of 900 to 1000 mbar at a V/III ratio of about 50 and a carrier gas composition of about 50% hydrogen and 50% nitrogen. The growth rate is ~220 μm/h and may be controlled with the help of the hydrogen chloride gas flow through/over the Ga source.

The micro-Raman measurements are carried out with a laser excitation wavelength of 532 nm (frequency-doubled Nd:YAG laser), an excitation power of 3 mW and a Labram800HR spectrometer of Jobin Yvon, wherein the laser is focused onto the sample by means of microscopic optics to a beam diameter of ~1 μm. The spectrometer is further calibrated by means of Ne plasma lines. The measurements are carried out in back scanning geometry, wherein the polarizer settings are chosen such that the $LPP^+$-mode can be detected. When scanning on the surface, the increment in x- and y-direction is ~2.5 mm. The margin from the wafer edge is 2 mm. When scanning on the wafer slit face lying perpendicular to the surface, the increment in z-direction is ~10 μm. Frequency and full width at half maximum (half-width) of the $E_2$-phonon and of the $LPP^+$-mode are determined by Lorentz line form analysis.

The measurements are further carried out in back scanning geometry, so that the polarizer settings are chosen such that the $E_2$-phonons can be detected [scanning on surface: z(y x/y)-z: scanning on slit face: y(x x)-y)]. Frequency and full width at half maximum (half-width) of the $E_2$-phonon are determined by Lorentz line form analysis.

The MDP measurements are carried out with a laser excitation wavelength 351 nm as well as with a beam diameter of ~50 μm. The photoconductivity signal is generated with the help of a microwave spectrometer/resonator by influencing the absorption behavior in the microwave region. Here, the laser with ~1.5 kHz is interrupted periodically, and the signal is detected by conventional lock-in technique. When scanning on the surface, the increment in x- and y-direction is ~2.5 mm. The margin from the wafer edge is 2 mm.

The micro photo-luminescence measurements are carried out at room temperature (293 K). A HeCd laser having an emission wavelength of 325 nm produces the excitation power. The density of the excitation power is 3 W/cm² (Schubert et al., Appl. Phys. Lett. 71, pp. 921 (1997)). When scanning on the surface, the increment in x- and y-direction is ~2.5 mm. The margin from the wafer edge is 2 mm.

The foregoing description of preferred embodiments of the invention has been presented for purposes of illustration and description only. It is not intended to be exhaustive or to limit the invention to the precise form disclosed, and modifications and variations are possible and/or would be apparent in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and that the claims encompass all embodiments of the invention, including the disclosed embodiments and their equivalents.

What is claimed is:

1. A doped, epitaxially grown III-N bulk crystal, wherein III denotes at least one element of the main group III of the periodic system selected from Al, Ga and In, wherein the doped III-N bulk crystal satisfies at least one of the following conditions (a) to (c):
   (a) in a micro-Raman mapping on a plane
      (i) parallel to a growth plane and/or
      (ii) in a growth direction
   a standard deviation of the measured frequency positions of the LPP$^+$-mode
   in case of (i) is 5% or lower, and
   in case of (ii) is 10% or lower;
   (b) in an MDP mapping on a plane
      (i) parallel to a growth plane and/or
      (ii) in a growth direction
   a standard deviation of the photoconductivity signals
   in case of (i) is 5% or lower, and
   in case of (ii) is 10% or lower;
   (c) in a micro photoluminescence mapping on a plane
      (i) parallel to a growth plane and/or
      (ii) in a growth direction
   a standard deviation of the line width of the D$^0$X transition
   in case of (i) is 5% or lower, and
   in case of (ii) is 10% or lower.

2. The doped, epitaxially grown III-N bulk crystal according to claim 1, wherein in a micro-Raman mapping on a plane
   (i) parallel to a growth plane and/or
   (ii) in a growth direction
   a standard deviation of the measured half-widths of the E$_2$-phonon
   in case of (i) is 5% or lower, and
   in case of (ii) is 5% or lower.

3. The doped, epitaxially grown III-N bulk crystal according to claim 1, wherein the doped III-N bulk crystal has a circular or almost circular cross-section, and the diameter of the III-N bulk crystal is ≥0.5 cm.

4. The doped, epitaxially grown III-N bulk crystal according to claim 1, wherein the length of the doped, epitaxially grown III-N bulk crystal is ≥0.1 mm.

5. The doped, epitaxially grown III-N bulk crystal according to claim 1, wherein the length of the doped, epitaxially grown III-N bulk crystal is ≥1 mm.

6. The doped, epitaxially grown III-N bulk crystal according to claim 1, wherein the length of the doped, epitaxially grown III-N bulk crystal is ≥1 cm.

7. The doped III-N bulk crystal according to claim 1, wherein the length of the doped, epitaxially grown III-N bulk crystal is ≥3 cm.

8. The doped, epitaxially grown III-N bulk crystal according to claim 1, wherein the doped III-N bulk crystal is grown by epitaxy above a foreign substrate selected from the group consisting of sapphire, silicon carbide, gallium arsenide, lithium aluminate and silicon.

9. The doped, epitaxially grown III-N bulk crystal according to claim 1, wherein the doped III-N bulk crystal is grown by epitaxy on a doped or undoped GaN substrate as a substrate, or on a foreign substrate having GaN deposited on a foreign substrate.

10. The doped, epitaxially grown III-N bulk crystal according to claim 1, wherein the doped III-N bulk crystal is grown by epitaxy comprising a mixed feeding from a common source material in which at least one dopant has been added to the at least one group III starting material.

11. The doped, epitaxially grown III-N bulk crystal according to claim 10, wherein the common source material comprises at least one dopant in elemental form and the at least one group III starting material in elemental form.

12. The doped, epitaxially grown III-N bulk crystal according to claim 10, wherein the common source material is in the form of a solid solution, an alloy or a mixed melt of the at least one dopant and the at least one group III starting material.

13. The doped, epitaxially grown III-N bulk crystal according to claim 1, wherein the doped III-N bulk crystal is grown by hydride vapor phase epitaxy.

14. The doped, epitaxially grown III-N bulk crystal according to claim 1, wherein the dopant is selected from the group consisting of silicon, tellurium, magnesium, iron, germanium, tin, selenium, beryllium, vanadium, manganese, zinc, chrome, nickel, copper and a mixture thereof.

15. A free-standing doped III-N substrate, wherein III denotes at least one element of the main group III of the periodic system selected from Al, Ga and In,
   wherein the free-standing doped III-N substrate satisfies at least one of the following conditions (a) to (c):
   (a) in a micro-Raman mapping on a plane
      (i) parallel to a growth plane and/or
      (ii) in a growth direction
   a standard deviation of the measured frequency positions of the LPP$^+$-mode
   in case of (i) is 5% or lower, and
   in case of (ii) is 5% or lower;
   (b) in an MDP mapping on a plane
      (i) parallel to a growth plane and/or
      (ii) in a growth direction
   a standard deviation of the photoconductivity signals
   in case of (i) is 5% or lower, and
   in case of (ii) is 5% or lower;
   (c) in a micro photoluminescence mapping on a plane
      (i) parallel to a growth plane and/or
      (ii) in a growth direction
   a standard deviation of the line width of the D° X transition
   in case of (i) is 5% or lower, and
   in case of (ii) is 5% or lower.

16. The free-standing doped III-N substrate according to claim 15, wherein in a micro-Raman mapping on a plane
   (i) parallel to a growth plane and/or
   (ii) in a growth direction
   a standard deviation of the measured half-widths of the E$_2$-phonon
   in case of (i) is 5% or lower, and
   in case of (ii) is 5% or lower.

17. The free-standing doped III-N substrate according to claim 15, which has a circular or almost circular cross-section, and the diameter of the substrate is ≥5 cm.

18. The free-standing doped III-N substrate according to claim 15, which has been separated from a doped, epitaxially grown III-N bulk crystal, wherein the doped III-N bulk crystal satisfies at least one of the following conditions (d) to (f):
   (d) in a micro-Raman mapping on a plane
      (i) parallel to a growth plane and/or
      (ii) in a growth direction
   a standard deviation of the measured frequency positions of the LPP$^+$-mode
   in case of (i) is 5% or lower, and
   in case of (ii) is 10% or lower;

(e) in an MDP mapping on a plane
  (i) parallel to a growth plane and/or
  (ii) in a growth direction
a standard deviation of the photoconductivity signals
  in case of (i) is 5% or lower, and
  in case of (ii) is 10% or lower;
(f) in a micro photoluminescence mapping on a plane
  (i) parallel to a growth plane and/or
  (ii) in a growth direction
a standard deviation of the line width of the $D°X$ transition
  in case of (i) is 5% or lower, and
  in case of (ii) is 10% or lower.

\* \* \* \* \*